United States Patent
Takahashi

(10) Patent No.: US 8,623,225 B2
(45) Date of Patent: Jan. 7, 2014

(54) PRODUCTION METHOD OF METALLIZED CERAMIC SUBSTRATE

(75) Inventor: Naoto Takahashi, Yamaguchi (JP)

(73) Assignee: Tokuyama Corporation, Shunan-shi, Yamaguchi (JP)

( * ) Notice: Subject to any disclaimer, the term of this patent is extended or adjusted under 35 U.S.C. 154(b) by 0 days.

(21) Appl. No.: 13/581,668

(22) PCT Filed: Feb. 21, 2011

(86) PCT No.: PCT/JP2011/053706
§ 371 (c)(1),
(2), (4) Date: Aug. 29, 2012

(87) PCT Pub. No.: WO2011/108388
PCT Pub. Date: Sep. 9, 2011

(65) Prior Publication Data
US 2013/0001199 A1 Jan. 3, 2013

(30) Foreign Application Priority Data
Mar. 2, 2010 (JP) ................................. 2010-045294

(51) Int. Cl.
*H01B 13/00* (2006.01)
(52) U.S. Cl.
USPC .......................................................... 216/13
(58) Field of Classification Search
USPC .......................................................... 216/13
See application file for complete search history.

(56) References Cited

U.S. PATENT DOCUMENTS

| 5,176,772 A * | 1/1993 | Ohtaki ...................... 156/89.15 |
| 2001/0029665 A1 | 10/2001 | Hashimoto et al. |

FOREIGN PATENT DOCUMENTS

| EP | 1 829 848 A1 | 9/2007 |
| JP | 61-51988 A | 3/1986 |
| JP | 05-074971 A | 3/1993 |
| JP | 06-085434 A | 3/1994 |
| JP | 07-183657 A | 7/1995 |
| JP | 2001-267725 A | 9/2001 |
| JP | 2002-280709 A | 9/2002 |
| WO | 2006/064793 A | 6/2006 |

OTHER PUBLICATIONS

International Search Report: mailed May 24, 2011; PCT/JP2011/053706.

* cited by examiner

*Primary Examiner* — Roberts Culbert
(74) *Attorney, Agent, or Firm* — Ladas & Parry LLP

(57) ABSTRACT

The present invention provides a method of forming a fine pattern by the post-firing method. The production method of a metallized ceramic substrate comprises: a first step of forming an organic base layer on a ceramic substrate; a second step of forming a metal paste layer on the organic base layer to produce a metallized ceramic substrate precursor; and a third step of firing the metallized ceramic substrate precursor, wherein the organic base layer is a layer which absorbs a solvent in the metal paste layer and thermally decomposes at a temperature of firing the metal paste layer.

3 Claims, 2 Drawing Sheets

PRODUCTION METHOD OF METALLIZED CERAMIC SUBSTRATE

TECHNICAL FIELD

The present invention relates to a production method of a metallized ceramic substrate. In specific, it relates to a production method of a metallized ceramic substrate which enables formation of a fine pattern with narrowly-spaced metallized patterns.

BACKGROUND ART

As a production method of a metallized ceramic substrate, the co-firing method (simultaneous firing method) and the post-firing method (sequential firing method) are commonly known. The co-firing method is a method in which to form a metal paste layer on a non-fired ceramic substrate precursor called a green sheet, thereby produce a metallized ceramic substrate precursor, and then fire this. In this method, the green sheet and the metal paste layer are fired simultaneously.

The post-firing method is a method in which to form a metal paste layer on a ceramic substrate obtained by firing a green sheet, thereby produce a metallized ceramic substrate precursor, and then fire this. In this method, the green sheet and the metal paste layer are fired sequentially.

Both methods enable a metallized pattern to be formed on a ceramic substrate, and the resultant substrate is mainly used as a substrate for mounting an electronic component. As for the substrate for mounting an electronic component, further enhancement of precision and fineness of the metallized pattern is required as the component to be mounted becomes smaller. At present, such requirements cannot be met by the conventional production methods.

For example, in a case of forming wiring by the co-firing method, the green sheet easily shrinks unevenly at the time of firing; and when a square-shaped green sheet is sintered for instance, the sheet is caused to shrink slightly in a way that the central portion of each side of the square warps inwardly, and consequently the substrate deforms into a star-like shape. Therefore, when a number of metallized patterns in the same shape are formed on one green sheet, the patterns inevitably have a slightly deformed shape depending on the area where they are formed.

On the other hand, in a case of forming a metallized pattern by the post-firing method, a conductive paste is directly applied onto a ceramic substrate and dried, and then fired to thereby form the metallized pattern. When the conductive paste layer is fired, it shrinks in its thickness direction; however, it hardly shrinks in it planar direction. Therefore, the problem that the shape of the pattern changes depending on the position as seen in the co-firing method does not occur.

However, in the post-firing method, even if the metal paste is applied in accordance with a shape of an intended circuit pattern, the metal paste sometimes runs or bleeds before being fired. Consequently, refinement of the pattern is hindered. This is because when the metal paste "runs" or "bleeds", a short circuit is sometimes caused between the wirings on the resultant metallized ceramic substrate, leading to degradation of the reliability thereof. In general, the post-firing method only enables, at best, formation of a metallized pattern wherein the gap (usually also called a space) between the metallized patterns is about 50 µm.

In order to solve the problems of the running and bleeding of the conductive paste as seen in the above post-firing method, the following suggestions have been made. Patent Document 1 suggests a method for forming a circuit, wherein an adhesive photosensitive resin layer is formed on a heat-resistant substrate; a circuit pattern is exposed to eliminate the adhesiveness of the exposed part; thereafter particles to form a circuit are contacted and adhered thereto; and the resultant is fired.

Patent Document 2 suggests a production method of a ceramic circuit substrate, wherein by using a conductive paste, a first circuit is formed on a resin film coated with a mold release agent; this is transferred to a surface of a ceramic substrate coated with a thermoplastic resin; and the resultant is fired.

Patent Document 3 suggests a production method of a ceramic circuit substrate, wherein a copper conductor paste is printed onto a substrate made of a ceramic and is fired to form a copper conductor circuit; thereafter the bleeding part of the copper conductor appearing on the edge of the circuit is dissolved to be removed; and the edge is treated sharply.

In addition, Patent Document 4 suggests a production method of a metallized ceramic substrate, wherein a ceramic paste layer is formed on a ceramic substrate, and a conductive paste layer is formed on the ceramic paste layer, to produce a substrate precursor; and the substrate precursor is fired.

CITATION LIST

Patent Document

Patent Document 1: Japanese Patent Application Laid-Open (JP-A) No. 5-74971
Patent Document 2: JP-A No. 6-85434
Patent Document 3: JP-A No. 2002-280709
Patent Document 4: WO 2006/064793

SUMMARY OF THE INVENTION

Problems to be Solved by the Invention

However, the methods in Patent Documents 1 to 3 involve a number of steps, thus being very laborious. Further, in the method of Patent Document 4, because the ceramic paste layer and the conductive paste layer are fired simultaneously, it is necessary to set a firing temperature high enough to be able to sinter the ceramic. Therefore, the kind of metal to form the conductive paste is limited to a high-melting-point metal such as tungsten; and in a case of using a metal paste containing copper, silver, and the like, this method cannot be adopted. In the case of using the metal paste containing copper, silver, and the like, the co-firing method cannot be adopted due to the limitations on the firing temperature, and therefore a method of forming a fine pattern by the post-firing method is desired.

Means for Solving the Problems

The inventors conducted intensive studies on the method of forming a fine pattern by the post-firing method; and as a result, they obtained the following findings.

(1) In the post-firing method, a metal paste is applied onto a ceramic substrate, and then fired. However, because the ceramic substrate does not absorb a solvent, the metal paste runs or bleeds.

(2) In order to solve this problem, a layer to absorb the solvent in the metal paste (a solvent absorption layer) is formed on the ceramic substrate.

(3) The solvent absorption layer needs to be a layer that decomposes and disappears at the time of firing. By this, the adhesiveness of a metallized pattern to the ceramic substrate can be ensured (4) In a case of using a tungsten paste, the firing temperature is high; therefore the solvent absorption layer decomposes and disappears at the time of firing, no matter what kind of organic resin forms the solvent absorption layer. On the other hand, in a case of using a copper paste, a silver paste, or a copper-silver alloy paste, the firing temperature is relatively low; therefore it is necessary to use a solvent absorption layer that decomposes and disappears at such a temperature.

(5) Especially when the copper paste is used, the firing needs to be carried out under a non-oxidizing atmosphere. Further, when a metal paste containing titanium is used in order to enhance the adhesiveness between the ceramic substrate and the metallized pattern, the firing needs to be carried out under vacuum. Accordingly, it is necessary to use a solvent absorption layer that decomposes and disappears under such conditions.

(6) In order to enable the solvent absorption layer to have a sufficient solvent absorbing capability, it is necessary to form the solvent absorption layer such that it has voids, by using a resin-dispersed fluid containing resin particles in a predetermined particle size.

(7) When the copper paste or the metal paste containing titanium is used, the firing needs to be carried out under a non-oxidizing atmosphere; therefore, carbonous residues attributed to the solvent absorption layer may be generated. So when it is necessary to perform plating on the metallized pattern, the carbonous residues need to be removed before the plating.

Based on the above findings, the inventors have completed the below invention. It should be noted that although the reference numerals shown in the accompanying drawings are added in parentheses in order to make the present invention easy to understand, the present invention is not limited to the embodiments shown in the drawings.

The present invention is a production method of a metallized ceramic substrate (100) comprising: a first step of forming an organic base layer (20) on a ceramic substrate (10); a second step of forming a metal paste layer (30) on the organic base layer (20) to produce a metallized ceramic substrate precursor (50); and a third step of firing the metallized ceramic substrate precursor (50), wherein the organic base layer (20) is a layer which absorbs a solvent in the metal paste layer (30) and thermally decomposes at a temperature of firing the metal paste layer (30).

In the present invention, a layer thickness of the organic base layer (20) is preferably 0.1 μm or more and 1.0 μm or less.

In the present invention, a metal paste for forming the metal paste layer (30) is preferably any one of a copper paste, a silver paste, a copper-silver alloy paste, and a tungsten paste.

In the present invention, in a case of using the copper paste as the metal paste for forming the metal paste layer (30), the organic base layer (20) is preferably an acrylic resin layer. In addition, the acrylic resin layer is preferably formed by a resin-dispersed fluid containing acrylic particles having a particle size of 0.05 μm or more and 0.80 μm or less.

In the present invention, the "particle size" means a median diameter obtained in measurement by the dynamic light scattering method.

In the present invention, in a case of performing plating on a metallized pattern (40) formed, the substrate (100) obtained is preferably etched prior to the plating.

Effects of the Invention

According to the production method of a metallized ceramic substrate (100) of the present invention, the organic base layer (20) is formed on the ceramic substrate (10), and then the metal paste layer (30) is formed on the organic base layer (20); therefore, the organic base layer (20) absorbs the solvent in the metal paste layer (30). This can prevent the metal paste from running or bleeding, enabling production of a metallized ceramic substrate (100) having a fine pattern with narrowly-spaced metallized patterns (40). Further, the organic base layer (20) thermally decomposes and disappears at the time of firing and does not hinder the adhesiveness of the metallized pattern; therefore a metallized ceramic substrate (100) having a favorable adhesiveness of the metallized pattern (40) can be produced.

MODES FOR CARRYING OUT THE INVENTION

Figure 1:
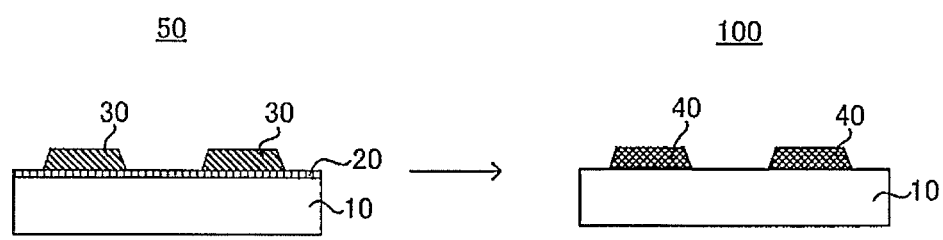
FIG. 1 is a conceptual view showing an outline of the production method of a metallized ceramic substrate (100) of the present invention.

The production method of a metallized substrate of the present invention comprises: a first step of forming an organic base layer on a ceramic substrate; a second step of forming a metal paste layer on the organic base layer to produce a metallized ceramic substrate precursor; and a third step of firing the metallized ceramic substrate precursor. FIG. 1 conceptually shows an outline of the production method of the present invention.

<First Step>

In the first step, the organic base layer 20 is formed on the ceramic substrate 10.

(Ceramic Substrate 10)

As for the ceramic substrate 10, a substrate constituted by a commonly known ceramic may be used without particular restrictions.

Examples of the ceramic as a constituent of the ceramic substrate 10 include: (i) oxide ceramics such as aluminum oxide ceramics, silicon oxide ceramics, calcium oxide ceramics, and magnesium oxide ceramics; (ii) nitride ceramics such as aluminum nitride ceramics, silicon nitride ceramics, and boron nitride ceramics; (iii) beryllium oxide, silicon carbide, mullite, and borosilicate glass. Among these, (ii) nitride ceramics are preferred; and especially aluminum nitride ceramics may be preferably used since they have high thermal conductivity.

As for the ceramic substrate 10 to be used in the production method of the present invention, it is favorable to use a sintered ceramic substrate, especially a sintered ceramic substrate in which the average particle size of the ceramic particles to constitute the sintered substrate is preferably 0.5 μm to 20 μm, more preferably 1 μm to 15 μm, for the reason that it is easily available and that a desired shape can be easily formed. Such a sintered ceramic substrate can be obtained by firing a green sheet constituted by a ceramic raw material powder having an average particle size of 0.1 μm to 15 μm, preferably 0.5 μm to 5 μm.

The green sheet may contain a sintering aid, an organic binder, and so on. As for the sintering aid, any sintering aids that are ordinarily used may be employed without particular restrictions depending on the kind of the ceramic raw material powder. Additionally, as for the organic binder, polyvinyl butyral, ethyl celluloses and/or acrylic resins are used. Poly-n-butyl methacrylate and polyvinyl butyral are especially favorably used since they enable favorable formability of the green sheet.

In view of the thermal conductivity of the resultant sintered body, it is favorable to use a green sheet for nitride ceramics formed by using as the ceramic raw material powder, nitride ceramic powder containing a sintering aid, particularly a green sheet for aluminum nitride formed by using as the raw material powder, aluminum nitride powder containing a sintering aid (e.g. yttrium or calcium oxide).

The shape of the ceramic substrate 10 to be used in the present invention is not particularly restricted as long as the ceramic substrate 10 has a surface on which the organic base layer 20 and the metal paste layer 30 can be formed. There may be used a sheet body or a sheet body a part of which is cut or pierced, or a substrate with a curved face. The ceramic substrate 10 may have via holes (namely, through-holes filled with an electrical conductor or metal paste) or inner-layer wiring. Such a raw material substrate can be easily produced by such methods as the co-firing method using a green sheet with the above described structure.

The size of the ceramic substrate 10 is not particularly restricted, but may be adequately determined depending on the intended use. For example, when the ceramic substrate 10 is for mounting an electronic component, the thickness of the substrate may be generally 0.1 mm to 2 mm, preferably 0.2 mm to 1 mm.

Further, the ceramic substrate 10 may be subjected to a surface treatment for the purpose of improving the wettability thereof to the resin-dispersed fluid in forming the organic base layer 20. For example, it may be subjected to a surface treatment by means of a physical treatment such as an oxygen plasma treatment, corona treatment, and UV ozone treatment, or by means of a chemical treatment such as alkali etching. These surface treatments are favorable especially in a case of using an aqueous resin-dispersed fluid having a relatively high surface tension.

(Organic Base Layer 20)

In the first step, a resin-dispersed fluid is applied onto the ceramic substrate 10, and in some cases the applied resin-dispersed fluid is dried, to form the organic base layer 20. The organic base layer 20 needs to be configured to be capable of absorbing a solvent in the below described metal paste layer 30, and of thermally decomposing at a temperature of firing the metal paste layer 30. In addition, the organic base layer 20 preferably has voids in order to enhance its solvent absorbing capability.

The resin-dispersed fluid for forming the organic base layer 20 preferably contains resin particles and a solvent, and is preferably in a state that the resin particles are not dissolved but dispersed in the solvent. Examples of the resin particles that may be used include: acrylic resin particles, styrene resin particles, methacrylate resin particles, and olefin resin particles. Additionally, examples of the solvent that may be used include: water; and organic solvents such as methanol, chloroform, and toluene. In view of not dissolving the resin particles, it is preferable to us water as the solvent. In a case of using resin particles like cross-linked resin particles which do not dissolve in the organic solvent, the organic solvent is preferably used in view that it dries easily. In order to form the organic base layer 20 having voids, the resin-dispersed fluid is preferably in a state that the resin particles are not dissolved but dispersed in the solvent; and in order to keep such a state, it is preferable to select a combination of the resin particles and the solvent. The resin-dispersed fluid may contain an additive such as an ordinarily-used dispersing agent. Further, for the purpose of enhancing the film strength of the organic base layer 20 and the adhesiveness thereof to the ceramic substrate 10, an organic binder that is soluble in the solvent to use may be added. When adding the organic binder, the amount of addition thereof is preferably 50 parts by mass or less with respect to 100 parts by mass of the resin particles. If the amount of addition of the organic binder is too large, the organic binder will fill up the voids in the organic base layer 20, and therefore the solvent absorbability of the organic base layer 20 is likely to deteriorate.

The particle size of the resin particle is not particularly restricted; however, it is preferably 0.05 µm or more and 0.80 µm or less, and more preferably 0.08 µm or more and 0.40 µm or less. If the particle size of the resin particle is too small, the organic base layer 20 formed becomes dense, and therefore the solvent absorbability thereof is likely to deteriorate. On the other hand, if the particle size of the resin particles is too large, the thickness of the organic base layer 20 increases and the organic base layer 20 may not be able to have a desired thickness. In addition, the surface area of the resin particles to form the organic base layer 20 decreases, and therefore the solvent absorbability is likely to deteriorate. Here, this particle size is a median diameter obtained in measurement by the dynamic light scattering method.

The application method to be adopted in forming the organic base layer 20 is not particularly restricted; known application methods may be adopted, for example coating methods such as dip coating and spray coating, and printing methods such as screen printing and off-set printing. Among these, the dip coating method is preferred in that it enables uniform application of the resin-dispersed fluid in a thin layer.

The content rate of the resin particles in the resin-dispersed fluid may be adequately adjusted to have the most suitable concentration depending on the application method to adopt and the kind of the solvent to use. For example, in a case of employing water as the solvent and the dip coating method as the application method, the content rate of the resin particles is preferably 1 mass % or more and 20 mass % or less, based on the total mass (100 mass %) of the resin-dispersed fluid. In addition, in a case of using an additive, the content thereof is preferably 5 mass % or less.

When the high-melting-point metal paste such as the tungsten paste and the molybdenum paste is used as the below described metal paste, firing is carried out at a high temperature; therefore, the type of the organic base layer 20 is not particularly restricted. Any type of organic base layer 20 maybe formed as long as it can absorb the solvent in the metal paste layer 30. This is because the firing is carried out at a high temperature, and thus any type of organic base layer 20 can decompose and disappear.

When the silver paste is used as the metal paste, the firing temperature is lower, compared with the case of using the above high-melting point metal paste. Examples of the resin particles capable of forming an organic base layer 20 that decomposes and disappears even at such a temperature may be acrylic resin particles and styrene resin particles. Further, when the copper paste is used as the metal paste, the firing is carried out in a nitrogen atmosphere or under vacuum in order to prevent copper from being oxidized. Further, when the metal paste containing titanium is used, the firing is carried out under vacuum. In these cases, the acrylic resin particles are preferably used as the resin particle as they can form an organic base layer 20 that thermally decomposes and disappears even under such firing conditions.

In the method of the present invention, it is preferable to dry the organic base layer 20 before applying the metal paste to form the metal paste layer 30. By evaporating the solvent contained in the organic base layer 20 to remove it, the solvent which is contained in the metal paste applied onto the organic base layer 20 can be more easily absorbed; therefore, the effect of preventing the running or bleeding of the metal paste layer 30 can be increased. The organic base layer 20 can be favorably dried by being kept in the air at a temperature of 60° C. to 120° C. for about 2 to 20 minutes.

The thickness of the organic base layer 20 is preferably 0.1 µm or more and 1.0 µm or less, and more preferably 0.2 µm or more and 0.5 µm or less. If the organic base layer 20 is too thin, it may not be able to absorb the solvent in the metal paste layer 30 sufficiently. On the other hand, if it is too thick, the adhesiveness of the metallized pattern formed is likely to deteriorate. In the present invention, the thickness of the organic base layer 20 refers to a thickness obtained after applying the resin-dispersed fluid onto the ceramic substrate 10, drying it, and thereby volatilizing the solvent in the organic base layer 20.

<Second Step>

In the second step, the metal paste layer 30 is formed on the organic base layer 20 formed in the first step, thereby producing the metallized ceramic substrate precursor 50.

In the second step, the metal paste layer 30 is formed by applying the metal paste in a predetermined pattern onto the organic base layer 20 formed on the ceramic substrate 10, and drying it as needed. Since the organic base layer 20 as a lower layer absorbs the organic solvent contained in the metal paste layer 30, the metal paste applied is inhibited from running or bleeding, enabling formation of a fine pattern.

Therefore, according to the production method of the present invention comprising the step of forming such a metal paste layer 30, it is possible to produce with high yields: a metallized ceramic substrate comprising a conductive layer (metallized layer) with a fine pattern in which the space between the conductor lines (wirings) is 80 µm to 10 µm, preferably 50 µm to 10 µm, and most preferably 30 µm to 15 µm; and also a metallized ceramic substrate comprising a metallized layer with a fine pattern in which the line and space is preferably 80/80 µm or less, more preferably 50/50 µm or less, and especially preferably 30/30 µm or less. When such a metallized ceramic substrate is used as a circuit substrate, the circuit substrate becomes highly reliable, with a fine pattern and without causing a short circuit. The expression that "the line and space is X/Y µm" means that a plurality of conductor lines (wirings) having a line width of X µm can be formed, with a space of almost Y µm.

Further, the metallized pattern 40 can be formed not only as wiring but also as a recognition marker (a marker for position adjustment at a time of mounting) on the metallized substrate. When the recognition marker is formed by the method of the present invention, the shape of the marker can be clearly identified; therefore there is an advantage that the misidentification of the marker can be reduced.

As for the metal paste to be used in the present invention, a known metal paste made of such components as a metal powder, organic binder, organic solvent, dispersing agent, and plasticizer may be employed without particular restrictions.

Examples of the metal powder to be contained in the metal paste may be metal powders of tungsten, molybdenum, gold, silver, copper, copper-silver alloy etc. In particular, with the present invention, even in a case of using a metal paste containing gold, silver, copper, and copper-silver alloy, it is possible to produce a metallized ceramic substrate with a fine pattern, which has been difficult to produce by the conventional methods. As such, the present invention is especially effective in that case.

The metal paste may contain titanium hydride powder. In a case of using a nitride ceramic substrate as the substrate, by using the metal paste containing titanium hydride powder, a titanium nitride layer will be formed between the metallized pattern 40 and the nitride ceramic substrate 10 through firing, and thereby the adhesiveness of the metallized pattern 40 will improve. Therefore this is effective when using the metal paste containing gold, silver, copper, and copper-silver alloy, which makes it difficult to enhance the adhesiveness of the metallized pattern 40 to the ceramic substrate 10. The amount of titanium hydride powder to be added is preferably 1 part by mass or more and 10 parts by mass of less based on the total mass, as 100 parts by mass, of the above gold, silver, copper, and copper-silver alloy powder.

As for the organic binder to be contained in the metal paste, a known material may be used without particular restrictions. Examples thereof include: acrylic resins such as polyacrylic acid ester, and polymethacrylic acid ester; cellulose resins such as methylcellulose, hydroxymethylcellulose, nitrocellulose and cellulose acetate butyrate; vinyl-group-containing resins such as polyvinyl butyral, polyvinyl alcohol, and polyvinyl chloride; hydrocarbon resins such as polyolefin; and oxygen-containing resins such as polyethylene oxide. These may be used alone, or two or more of these may be used in a mixture form.

As for the organic solvent to be contained in the metal paste, a known material may be employed without particular restrictions. Examples thereof include: toluene, ethyl acetate, terpineol, butyl carbitolacetate, and texanol. As for the dispersing agent to be contained in the metal paste, a known material may be employed without particular restrictions. Examples thereof include phosphate ester type dispersing agents and polycarboxylic acid type dispersing agents. As for the plasticizer to be contained in the metal paste, a known material may be employed without particular restrictions. Examples thereof include: dioctyl phthalate, dibutyl phthalate, di-isononyl phthalate, di-isodecyl phthalate, and dioctyl adipate.

The metal paste contains the above metal powder, organic binder, and organic solvent. The method of the present invention especially exerts its advantageous effects when a metal paste is used in which metal paste the viscosity measured by a spiral-type viscometer under the conditions of a rotation speed of 5 rpm and a temperature of 25° C., is preferably 50 Pa·s to 350 Pa·s, more preferably 100 Pa·s to 300 Pa·s, and especially preferably 150 Pa·to 250 Pa·s, by adjusting the amount of the metal powder, organic binder, and organic solvent. As to the specific amount of the organic binder and organic solvent, the optimal value thereof differs depending on the application method of the metal paste, the use of the resultant metallized ceramic substrate, the kind and shape of the metal powder to use, and the kind of organic binder and organic solvent to use; therefore it is not necessarily limited. When the metal paste containing the organic binder and the organic solvent satisfies the above viscosity range, it can be easily applied, thus enabling improvement of the productivity. Further, when using the metal paste in the above viscosity range containing the organic binder and the organic solvent, by arranging the organic base layer, the effect of preventing the metal paste from running or bleeding can be more remarkable. It should be noted that the above metal paste may additionally contain other known additives (for example, a dispersing agent and plasticizer).

The metal paste may be applied by a known method such as screen printing, calendar printing, and pad printing. The thickness of the metal paste layer 30 to be formed is not particularly limited; however, it is generally 1 µm to 100 µm, preferably 5 µm to 30 µm. It should be noted that the thickness of the metal paste layer 30 is a thickness obtained after applying the metal paste onto the organic base layer 20, drying it, and thereby volatilizing the solvent in the metal paste layer 30.

When applying the metal paste to form the metal paste layer 30, the metal paste may be repeatedly applied to be layered. At this time, the following may be done: the metal paste is applied and thereafter dried, and then the metal paste is again applied and dried; or the metal paste is applied repeatedly, and thereafter the metal paste in a plurality of layers is dried as a whole. In addition, the kind of the paste of the metal paste layer to be layered may be the same as that of the lower layer, or it may be different from that of the lower layer.

In the method of the present invention, the metallized ceramic substrate precursor 50 wherein the organic base layer 20 and the metal paste layer 30 are formed on the ceramic substrate 10 is fired (third step), and thereby the metallized ceramic substrate 100 as a product of the present invention can be obtained; however, degreasing may be carried out prior to the firing.

Degreasing is carried out by thermally treating the metallized ceramic substrate precursor 50 in an atmosphere of: an oxidized gas such as oxygen and air; a reductive gas such as hydrogen; an inert gas such as argon and nitrogen; carbon dioxide; a mixed gas thereof; or a humidified gas in which water vapor is mixed. The conditions of the thermal treatment may be adequately selected from the range of a temperature: 250° C. to 1200° C., and a holding time: 1 minute to 1000 minutes, depending on the type and amount of the organic components contained in the metallized ceramic substrate precursor 50.

<Third Step>

In the third step, the metallized ceramic substrate precursor 50 produced above is fired. The ordinarily employed firing conditions are adequately adopted herein depending on the kind of the metal paste used (more specifically, the kind of the metal powder in the metal paste).

For example, when the high-melting-point metal paste such as the tungsten paste and molybdenum paste is used, the firing maybe carried out at a temperature of 1600° C. to 2000° C., preferably 1700° C. to 1850° C., for 1 hour to 20 hours, preferably 2 to 10 hours. As to the firing atmosphere, the firing may be carried out in an atmosphere of a non-oxidizing gas such as nitrogen gas, at normal pressures.

When the silver or gold paste is used, the firing may be carried out at a temperature of 750° C. to 950° C., preferably 800° C. to 900° C., for one minute to one hour, preferably 5 to 30 minutes. As to the firing atmosphere, the firing may be carried out in the air, at normal pressures.

When the copper paste is used, the firing may be carried out at a temperature of 750° C. to 1000° C., preferably 800° C. to 950° C., for 1 minute to 2 hours, preferably 5 minutes to 1 hour. As to the firing atmosphere, the firing is preferably performed in an atmosphere of a non-oxidizing gas such as nitrogen gas, or under vacuum; and when the firing is performed in the atmosphere of a non-oxidizing gas, it may be done at normal pressures.

Further, when the metal paste containing the titanium component is used to improve the adhesiveness of the metallized pattern 40 to the ceramic substrate 10, the firing is preferably carried out under vacuum.

When the silver, gold, or copper paste, or the paste of the alloy of these metals is used, the firing is carried out at a relatively low temperature as mentioned above. Therefore, it is necessary to form an organic base layer 20 that decomposes and disappears at such a temperature. Of all, when the copper paste is used, the firing is carried out in the non-oxidizing atmosphere. Therefore, it is preferable to form an organic base layer 20 by an acrylic resin layer that decomposes and disappears under such conditions.

<Fourth Step and Fifth Step>

When the metallized pattern 40 made of easily-oxidizable copper or copper-silver alloy is formed, it is preferable to perform plating on the surface of the metallized pattern 40. When the firing in the third step is carried out at a relatively low temperature in the non-oxidizing atmosphere as in the case of using the copper paste, carbonous residues attributed to the organic base layer 20 are likely to be generated. Therefore, when performing plating on the metallized pattern 40, it is preferable to carry out an etching step (fourth step) of removing the carbonous residues, and then carry out the plating step (fifth step)

The etching method is not particularly restricted; the wet etching is preferably adopted in view of the treatment efficiency and economic efficiency. For example, an alkali solution, permanganic acid solution, or the like may be used as an etching liquid. The plating method is not particularly restricted as long as the method that is carried out for the conventional metallized substrates is adopted. Examples of the plating method may be either electroless plating or electrolytic plating; and may be any one of nickel plating, tin plating, and alloy plating.

EXAMPLES

Example 1

(Formation of an Organic Base Layer)

Polymethyl methacrylate particles (non-crosslinked) having an average particle size of 0.15 µm in an amount of 100 parts by mass were added to 800 parts by mass of water, together with a dispersing agent in an amount of 4.5 parts by mass; and dispersed in the water by stirring the liquid for one hour with ultrasound waves irradiated, thereby preparing an acrylic-resin-dispersed fluid. A sintered aluminum nitride substrate (trade name: SH-30, manufactured by Tokuyama Corporation) having a thickness of 0.64 mm was immersed into thus prepared resin-dispersed fluid in such a manner that the surface of the substrate is perpendicular to the liquid phase of the resin-dispersed fluid. Subsequently, it was pulled up slowly at a certain speed; the surface of the substrate was coated with the resin-dispersed fluid; and the coating resin-dispersed fluid was dried at 80° C. for 10 minutes, thereby forming an organic base layer. At this point, the film thickness of the organic base layer was about 0.3 µm.

(Preparation of a Metal Paste 1)

A mortar was used to pre-mix 15 parts by mass of copper powder having an average particle size of 0.3 µm, 82 parts by mass of copper powder having an average particle size of 2 µm, and 3 parts by mass of titanium hydride powder having an average particle size of 5 µm, with a vehicle in which polyalkyl methacrylate was dissolved in terpineol; and thereafter a three-roll mill was used to subject the mixture to a dispersion treatment, thereby preparing a metal paste 1. When the viscosity of the prepared metal paste 1 was measured by a spiral-type viscometer, PCU-2-1, manufactured by Malcom Co., Ltd., it was 170 Pa·s at a temperature of 25° C. and a rotation speed of 5 rpm.

(Preparation of a Metal Paste 2)

A mortar was used to pre-mix Ag—Cu alloy powder (BAg-8; composition: 72 weight % of silver-28 weight % of copper) having an average particle size of 6 µm, with a vehicle in which polyalkyl methacrylate was dissolved in terpineol; and thereafter a three-roll mill was used to subject the mixture to a dispersion treatment, thereby preparing a metal paste 2. When the viscosity of the prepared metal paste 2 was measured by the above viscometer, it was 230 Pa·s at a temperature of 25° C. and a rotation speed of 5 rpm.

(Production of a Metallized Substrate)

The metal paste 1 prepared above was screen-printed onto the above sintered aluminum nitride substrate on which the organic base layer was formed, to form a stripe pattern having a line width of 200 μm and an inter-line space of 40 μm; and it was dried at 100° C. for 10 minutes to form a first paste layer. Subsequently, the metal paste 2 prepared above was screen-printed in such a manner as being layered on top of the first paste layer, to form the same pattern as that of the metal paste 1; and it was dried at 100° C. for 10 minutes to form a second paste layer. Next, the workpiece was fired at 850° C. for 30 minutes in a vacuum (vacuum degree: $4 \times 10^{-3}$ Pa to $8 \times 10^{-3}$ Pa), thereby obtaining a metallized substrate. Separately from this, a screen printing plate having a cross-shaped pattern of 50 μm in line width and 200 μm in length was used to produce a metallized substrate in a similar manner.

(Evaluation on the Bleeding of the Pattern)

Figure 2:
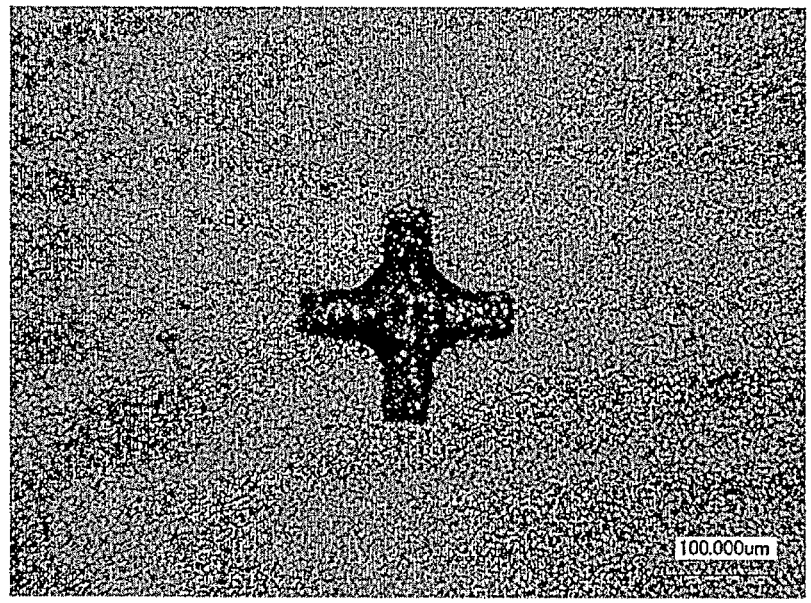
FIG. 2 is an enlarged view of a cross-shaped pattern in the metallized ceramic substrate obtained in Example 1.

When the space width between the stripe patterns of the substrate obtained above was measured by a measure scope, it was 40 μm, and bleeding of the pattern was hardly seen. In addition, the surface of the substrate on which surface the cross-shaped metallized layer was formed was observed by a video microscope. FIG. 2 shows the picture. As shown in FIG. 2, formation of the metallized pattern with little bleeding was confirmed.

Example 2

The acrylic-resin-dispersed fluid prepared in Example 1 was used to form an organic base layer on a sintered aluminum nitride substrate (trade name: SH-30, manufactured by Tokuyama Corporation) having a thickness of 0.64 mm. At this time, the organic base layer was formed in the same manner as in Example 1, except that the organic base layer was configured to have a film thickness of 0.8 μm by adjusting the speed of pulling up the substrate from the acrylic-resin-dispersed fluid. Thereafter, a metallized substrate was produced in the same manner as in Example 1, and the evaluation thereof was made. At this time, the space width between the stripe patterns was 40 μm; and bleeding of the pattern was hardly seen.

Example 3

Polymethyl methacrylate particles (non-crosslinked) having an average particle size of 0.09 μm in an amount of 100 parts by mass was dispersed in 800 parts by mass of water, to prepare an acrylic-resin-dispersed fluid. A sintered aluminum nitride substrate (trade name: SH-30, manufactured by Tokuyama Corporation) having a thickness of 0.64 mm was immersed into the prepared resin-dispersed fluid in such a manner that the surface of the substrate is perpendicular to the liquid phase of the resin-dispersed fluid. Subsequently, it was pulled up slowly at a certain speed; the surface of the substrate was coated with the resin-dispersed fluid; and the resin-dispersed fluid was dried at 80° C. for 10 minutes, thereby forming an organic base layer. At this point, the film thickness of the organic base layer was about 0.3 μm. Thereafter, a metallized substrate was produced in the same manner as in Example 1, and the evaluation thereof was made. At this time, the space width between the stripe patterns was 40 μm; and bleeding of the pattern was hardly seen.

Comparative Example 1

Figure 3:
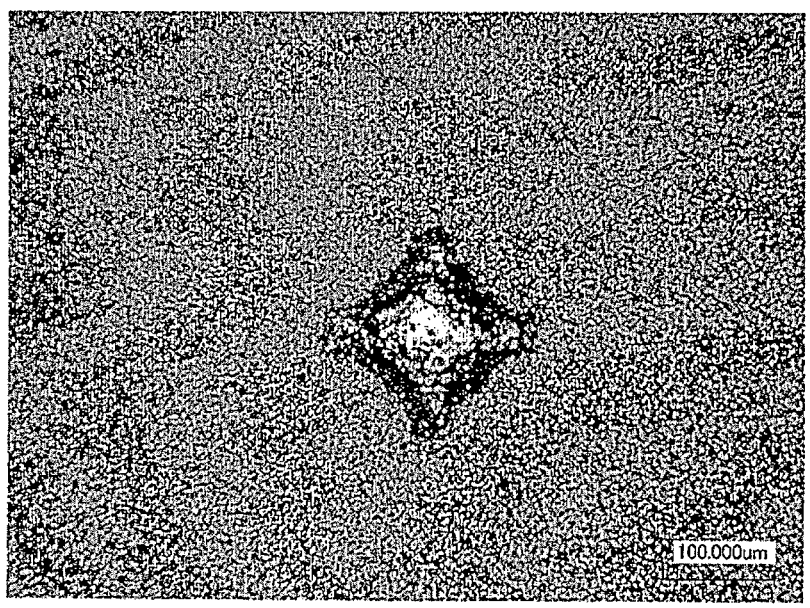
FIG. 3 is an enlarged view of a cross-shaped pattern in the metallized ceramic substrate obtained in Comparative Example 1.

A metallized substrate was produced in the same manner as in Example 1, except that the organic base layer was not formed on a sintered aluminum nitride substrate. When the space width between the metallized patterns of the resultant substrate was measured by a measure scope, it was 28 μm, which was much narrower than 40 μm as the desired space width, due to the bleeding of the pattern. In addition, the surface of the substrate on which surface the cross-shaped metallized layer was formed was observed by a video microscope. FIG. 3 shows the picture. As shown in FIG. 3, the pattern largely deformed due to the bleeding thereof.

INDUSTRIAL APPLICABILITY

The metallized ceramic substrate 100 produced by the production method of the present invention can be used as a substrate for mounting an electronic component.

DESCRIPTION OF THE REFERENCE NUMERALS

10 ceramic substrate
20 organic base layer
30 metal paste layer
40 metallized pattern
50 metallized ceramic substrate precursor
100 metallized ceramic substrate

The invention claimed is:

1. A production method of a metallized ceramic substrate comprising:
    a first step of forming an organic base layer on a ceramic substrate;
    a second step of forming a metal paste layer on the organic base layer to prepare a metallized ceramic substrate precursor; and
    a third step of firing the metallized ceramic substrate precursor,
    wherein the organic base layer is a layer which absorbs a solvent in the metal paste layer and thermally decomposes at a temperature of firing the metal paste layer;
        a metal paste to form the metal paste layer is a copper paste, and the organic base layer is an acrylic resin layer; and
        the acrylic resin layer is formed from a resin-dispersed fluid containing acrylic resin particles having a particle size of 0.05 μm or more and 0.80 μm or less.
2. The production method of a metallized ceramic substrate according to claim 1, wherein a layer thickness of the organic base layer is 0.1 μm or more and 1.0 μm or less.
3. The production method of a metallized ceramic substrate according to claim 1, further comprising:
    a fourth step of etching the resultant substrate; and
        a fifth step of performing plating on a metallized pattern formed.

* * * * *